July 26, 1966 D. O. KOCMICH 3,263,200

MICRO-LOGIC PACKAGE SPACER

Original Filed Jan. 30, 1963

Inventor:
Donald O. Kocmich,
by Gordon Needleman
Atty.

United States Patent Office 3,263,200
Patented July 26, 1966

3,263,200
MICRO-LOGIC PACKAGE SPACER
Donald O. Kocmich, Hillsborough, Calif., assignor to United-Carr Fastener Corporation, Boston, Mass., a corporation of Delaware Original application Jan. 30, 1963, Ser. No. 255,013. Divided and this application July 6, 1965, Ser. No. 472,395
1 Claim. (Cl. 339—17)

This invention is a divisional application of application Serial No. 255,013, filed January 30, 1963, now abandoned.

This invention relates generally to an electrical component assembly and more specifically to a device for securing electrical components to a circuit assembly.

An object of the present invention is to provide a mounting device for associating an electrical device with a circuit board.

Another object of the present invention is to provide a spacing device for engaging a transistor or the like having multiple leads with a circuit board.

A further object of the present invention is to provide a means of engaging an integrated circuit with a printed circuit board which does not require soldering of the leads to the board.

Still another object of the present invention is to provide a means of engaging a device with wire leads with a circuit board which does not require bending of the leads to engage the leads with the board.

Other objects of the invention will, in part, be obvious and will, in part, appear hereinafter.

Figure 1:
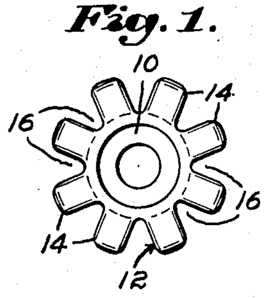
FIG. 1 is a top plan view of the mounting device.
Figure 2:
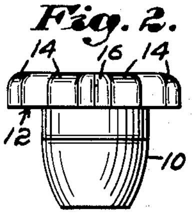
FIG. 2 is a side elevation of the mounting device shown in FIG. 1.
Figure 3:
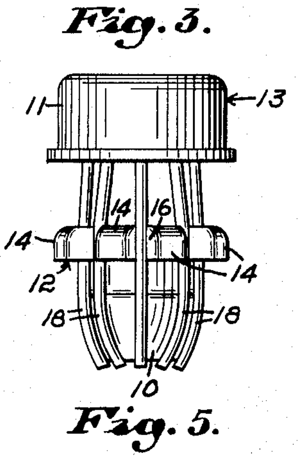
FIG. 3 is a side elevation of the mounting device shown in FIG. 1 engaged to an electrical element having multiple leads.
Figure 4:
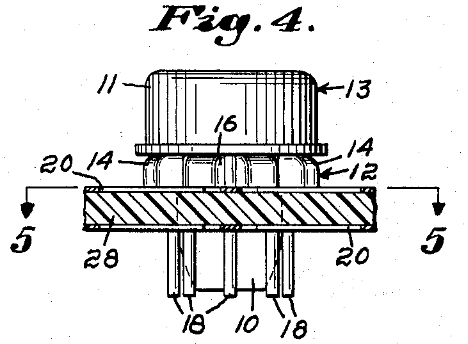
FIG. 4 is an elevation partly in section of the assembly shown in FIG. 3 engaged to an apertured printed circuit board.
Figure 5:
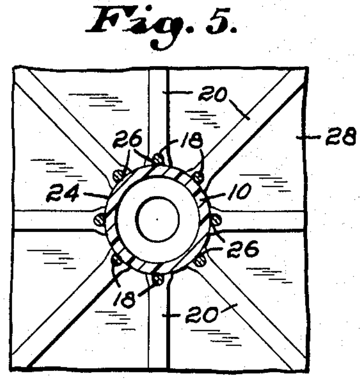
FIG. 5 is a section taken on line 5—5 of FIG. 4.
Figure 6:
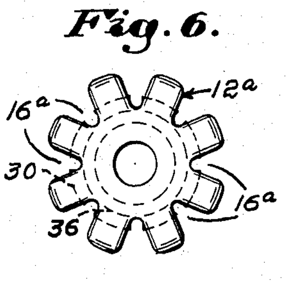
FIG. 6 is a top plan view of a variation of the mounting device shown in FIG. 1.
Figure 7:
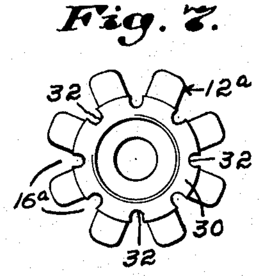
FIG. 7 is a bottom plan view of the mounting device shown in FIG. 6.
Figures 8, 9:
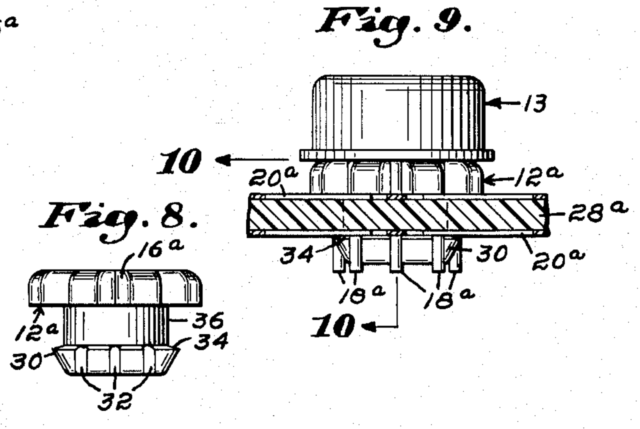
FIG. 8 is a side elevation of the mounting device shown in FIG. 6.
FIG. 9 is a side elevation partly in section of the mounting device shown in FIG. 6 assembled with an electrical element and apertured printed circuit board.
Figure 10:
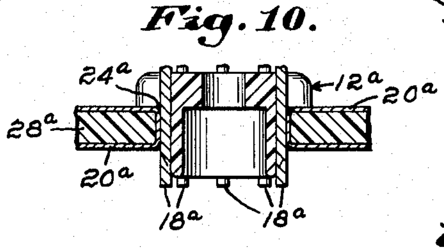
FIG. 10 is a section taken on line 10—10 of FIG. 9.

There is shown in the drawings an integrated circuit spacer or mounting comprising a body portion 10 and an integral, peripheral flange 12 extending radially from said body portion 10 as shown in FIG. 2. The flange 12 has a series of integral projections 14 spaced around the outer periphery of the flange 12 and spaced from each other to provide a series of contoured grooves 16. The body portion 10 is hollow and has a generally barrel-shaped external configuration. The walls of the grooves 16 may be provided with a plated or metalized surface, which would substantially increase electrical reliability and decrease contact resistance of lead engagement.

The integrated package 13 sometimes referred to as a "micro-logic" package comprises a miniaturized printed circuit having integrated transistor elements with a multiple series of leads 18 extending from and at right angles to the base portion of the integrated package 13. The leads are spaced from each other and define some geometric configuration such as a circle or a square.

Other electrical devices having wiring leads may also be utilized by this invention.

In the past the means of attaching the leads of the integrated circuit to a circuit board 28 has required a bending of these leads into engagement with the circuits 20 of the printed circuit board and a subsequent soldering of same. Usually, it also required that the leads be passed through a series of apertures formed in some type of holding element.

The circuit board 28 comprises a series of circuits spaced from each other and terminating at a wall, forming an aperture 24 through the circuit board. The termination of each of the circuits 20 at the wall forms a slight notch 26 which is metalized for the height of the wall.

To engage the applicant's integrated circuit spacer to the leads 18 of an integrated circuit and to the printed circuit board 28, each of the leads 18 is placed into a corresponding groove 16 of the spacer. This, of course, can very easily be done without the necessity of passing each of the leads simultaneously through a series of holes formed in a plug as has been done heretofore. The contour of the grooves 16 is formed to closely fit and hug a portion of each of the leads 18, which allows the spacer to be self-retained to the integrated circuit. In this position the integrated circuit is in superposed, abutting relationship to the flange 12 of the spacer. The leads 18 and the body portion 10 of the spacer are passed into the aperture 24 until the bottom surface of the flange 12 lies in superposed, abutting relationship to the circuit board 28. At the same time the greater diameter of the body portion 10, which is formed of a resilient material, having a greater diameter than the aperture 24 is flexed slightly inwardly with the leads 18 pressed against the notches 26 of their respective circuits 20. After engagement a portion of the body portion 10 would flex outward to securely engage the leads 18 in the notches 26. The loose ends of the leads 18 extending below the printed circuit board 28 may then be cut off and the assembly is complete.

A variation of the applicant's spacer is shown in FIGS. 6 through 10. In this case the flange **12*a* is the same as the flange 12 described hereinbefore. However, the body portion 36 is not barrel-shaped as the body portion 10 but consists of a hollow tube having at the opposite end from the flange 12*a* and spaced from the flange 12*a* a collar 30 extending radially outward from the body portion 36 and having radial, spaced slits 32 corresponding to the grooves 16*a* and having a common midline therewith. The collar 30 forms a shoulder 34 with the body portion 36**.

As stated heretofore, there is the possibility of having the body portion directly attached to the electrical element 13. In the case of the variant the base of the electrical element would assist in the snap engagement which occurs between the collar 30 and the aperture **24*a***.

The engagement of the variation with an integrated circuit is the same as the first embodiment, and the passage into the aperture **24*a* of the printed circuit board 28*a* is similar except that the thickness of the board corresponds to the distance between the bottom surface of the flange 12*a* and the shoulder 34. The diameter of the flange 12*a* is, of course, as in the case of the flange 12, greater than the diameter of the aperture formed through the circuit board, and the diameter of the collar 30 is slightly greater than the diameter of the aperture formed through the circuit board 28*a* so that the collar 30 is flexed inward as it passes through the aperture 24*a* and then flexes outward to snap beneath the lower surface of the board 28*a*. Once again the leads 18*a* are oriented to engage against the notches 16*a* formed by the wall of the aperture 24*a* and the printed circuits 20*a* as in the preferred embodiment. In this case prior to engagement the leads rest in the grooves 16***a* and the slits 32 in the spacer.

While there has been illustrated and described a preferred embodiment of the invention, it should be understood that the invention is best described by the following claim.

I claim:

A combination of an electrical element having at least two leads extending therefrom, a mounting associated with said electrical element and a circuit board having an inner wall defining an aperture therethrough, said mounting comprising a tubular flexible body portion and a flange integral with and extending radially from one end of said body portion and a collar spaced from said flange and integral with and extending radially from said body portion at the other end thereof, said flange having a series of peripheral projections spaced from each other to provide a series of grooves and said collar having a series of slits formed on the periphery thereof, each of said slits being aligned with a corresponding groove on said flange, each of said grooves having a lead positioned therein and also positioned in the aligned slot formed on said collar, said electrical element being in superposed, abutting relation to said flange and said flange in superposed, abutting relation to said support and a portion of said body portion circumscribed by said inner wall and said collar underlying in abutting relationship said support and each of said leads electrically engaging one of the circuits on said printed circuit board.

References Cited by the Examiner

UNITED STATES PATENTS

| | | | |
|---|---|---|---|
| 2,524,939 | 10/1950 | Stephan et al. | 339—17 |
| 2,606,228 | 8/1952 | Choujian | 339—66 |
| 2,711,522 | 6/1955 | Goodwin | 339—126 X |
| 2,881,405 | 4/1959 | Yarbrough | 339—17 |
| 3,051,864 | 8/1962 | Schade | 339—66 |
| 3,142,526 | 7/1964 | Edwards | 229—126 |

PATRICK A. CLIFFORD, *Primary Examiner.*

ALFRED S. TRASK, *Examiner.*